United States Patent [19]
Lee

[11] Patent Number: 5,382,548
[45] Date of Patent: Jan. 17, 1995

[54] METHOD FOR MAKING POLYSTALLINE SILICON THIN FILM

[75] Inventor: Jae W. Lee, Seoul, Rep. of Korea

[73] Assignee: Samsung Electronics Co., Ltd., Kyungki, Rep. of Korea

[21] Appl. No.: 998,683

[22] Filed: Dec. 30, 1992

[30] Foreign Application Priority Data

Jun. 30, 1992 [KR] Rep. of Korea .................. 11615

[51] Int. Cl.$^6$ ............................................. H01L 21/60
[52] U.S. Cl. .................................... 437/233; 437/109; 437/174; 148/DIG. 90
[58] Field of Search ............... 437/174, 233, 109, 111; 148/DIG. 93, DIG. 90, DIG. 98

[56] References Cited

U.S. PATENT DOCUMENTS 4,897,150  6/1990  Dooley et al. .................... 437/233
5,126,863  6/1992  Akira .

FOREIGN PATENT DOCUMENTS 4-6823  1/1992  Japan .................................... 437/233

Primary Examiner—Olik Chaudhuri
Assistant Examiner—S. Mulpuri
Attorney, Agent, or Firm—Charles R. Donohoe; Robert A. Westerlund, Jr.; Stephen R. Whitt

[57] ABSTRACT

A method for making a polycrystalline silicon (p-Si) thin film by heat treating an amorphous silicon (a-Si) thin film using a laser beam, including the steps of forming an a-Si thin film over a substrate, forming a metal reflection film over the a-Si thin film, forming, in the metal reflection film, windows each having a width smaller than the width of the regular strong energy portion of laser beam, annealing the portions of a-Si thin film disposed beneath the windows using a laser beam, removing the remaining portions of metal reflection film, each having a width smaller than the width of the regular strong energy portion of laser beam, to expose the portions of a-Si thin film disposed beneath the remaining portions of metal reflection film, and annealing the thus exposed portions of a-Si thin film disposed beneath the remaining portions of metal reflection film. A plurality of microlenses are formed disposed above edges of the portions of the metal reflection film remaining after the formation of the windows. Each microlens serves to refract the energy strength of the peripheral portion of laser beam toward the regular strong energy strength portion of laser beam and thus scatter the energy strength of the peripheral portion of laser beam.

8 Claims, 5 Drawing Sheets

METHOD FOR MAKING POLYSTALLINE SILICON THIN FILM

BACKGROUND OF THE INVENTION

Field of the Invention

The present invention relates to a method for making a polycrystalline silicon thin film, and more particularly to a method for making a polycrystalline silicon thin film by crystallizing an amorphous silicon thin film using a laser beam.

Description of the Prior Art

Recently, polycrystalline silicon (p-Si) thin films have been used for p-Si TFT liquid crystal displays (LeDs) and contact image sensors (CISs), in the dynamic random access memory (DRAM) and display fields. A method which is currently used in making such p-Si thin films comprises heat treating an amorphous silicon (a-Si) thin film or a microcrystalline silicon ($\mu$-Si) thin film at a high temperature of about 1,000° C. A p-Si thin film produced according to this method exhibits a superior characteristic, but encounters a phenomenon that its substrate is bent or laminated, due to the heat treatment at the high temperature. As a result, the method undesirably requires the use of expensive substrates made of a single crystal of silicon (c-Si) or of quartz. In particular, the phenomenon becomes more severe at a larger thickness of the thin film. In severe cases, photo-etching as a subsequent process can not be carried out.

As the crystallization of an a-Si thin film to form an p-Si thin film, there are two methods, that is, a solid phase crystallization (SPC) method and a laser annealing (LA) method. These methods are disclosed in U.S. Pat. Nos. 4,851,363 and 4,880,753 and Japanese Patent Laid-open Publication Nos. 62-104117, 63-119576, 64-025515, 02-033935 and 02-143559.

The SPC method has an advantage that an a-Si thin film can be uniformly crystallized to form a p-Si thin film. However, it encounters a limitation on the material of the substrate, since its heat treatment is carried out at a high temperature of about 1,000° C. Presently, researches are being made for performing the heat treatment at a lower temperature of about 600 °C. However, there are no heat treatments at low temperature capable of using a glass substrate (Extended Abstract of the 1991 Int. Conference on Solid State Device and Material, 1991, pp 571).

In order to solve such a problem, an excimer laser annealing (ELA) method has been proposed which comprises a heat treatment using an excimer laser beam for which the a-Si exhibits a high optical energy absorption. The excimer laser beam is a short wave-length pulse having a large beam size. Accordingly, it provides an advantage in annealing, in that its optical energy is absorbed into the surface of a-Si thin film and thus the amount of heat transferred to the substrate is small. However, this method has a problem in achieving a uniform heat treatment of the entire surface of substrate. When the excimer laser beam is scanned at the a-Si thin film on the substrate in an overlapped manner according to the conventional method, as shown in FIGS. 3 and 4, the laser beam energy is irregularly distributed throughout its all portions, as apparent from FIG. 1. As a result, portions of the a-Si to subjected to the annealing by the central high energy portion of the laser beam can be easily crystallized to form p-Si, while portions of the a-Si subjected to the annealing by the peripheral low energy portion of the laser beam still remain without any crystallization or are changed into $\mu$-Si, since the energy of laser beam absorbed by the a-Si is insufficient.

For solving the above-mentioned problem, another researches have been made to homogenize the laser beam. Even in such a homogenized laser beam, the energy cannot be regular throughout all portions thereof, as shown in FIG. 2. That is, the portion X in FIG. 2 receives a small amount of energy which is insufficient to crystallize a-Si. As a result, the a-Si absorbing the insufficient energy of the portion X is changed into $\mu$-Si. Of course, this $\mu$-Si may be crystallized into p-Si only by being subjected to an energy which is three times higher than the energy required for crystallizing a-Si to form p-Si, because once a-Si is changed into $\mu$-Si, the enthalpy increases by 30%. However, such a level of energy actually causes the thin film to be broken. As a result, the above-mentioned problem can not be basically solved.

Consequently, both p-Si and p-Si are present throughout the surface of substrate, even when the laser beam is scanned in an overlapped manner, as shown in FIGS. 3 and 4. In this case, the operation characteristic of an element produced is varied, depending on portions of the element, since the electrical characteristics of p-Si and $\mu$-Si are different from each other. The element also has no reliability, since the reaction characteristics to chemical materials and heat resistance characteristics of p-Si and $\mu$-Si may be varied during the photo-etching process.

SUMMARY OF THE INVENTION

Therefore, an object of the invention is to solve the above-mentioned problems encountered in the prior art and to provide a method for making a polycrystalline silicon thin film capable of uniformly crystallizing a-Si into p-Si, even using a heat treatment at a low temperature of not more than 600° C., by uniformly scanning the a-Si surface, using a laser beam of a short wavelength.

Another object of the invention is to provide a method for making a polycrystalline silicon thin film capable of utilizing a heat treatment at a low temperature and thus using an inexpensive glass substrate in place of an expensive Quartz substrate, thereby enabling one to obtain a great reduction in manufacture cost where the method is applied to the manufacture of display elements and similar products.

In accordance with the present invention, these objects can be accomplished by providing a method for making a polycrystalline silicon thin film by annealing an amorphous silicon thin film using a laser beam, comprising the steps of: forming an amorphous silicon thin film over a substrate; forming a metal reflection film over the amorphous silicon thin film; partially removing the metal reflection film, to form a plurality of spaced windows at the metal reflection film; forming a plurality of microlenses at predetermined positions above the remaining portions of the metal reflection film, respectively; annealing the portions of the amorphous silicon thin film disposed beneath the windows using the laser beam such that the regular strong energy portion of the laser beam is scanned at each window; removing the remaining metal reflection film and the microlenses, to expose portions of the amorphous silicon thin film disposed beneath the remaining metal reflection film; and annealing the exposed portions of the amorphous silicon thin film using the laser beam such that the regular strong energy portion of the laser beam is scanned at each exposed portion.

BRIEF DESCRIPTION OF THE DRAWINGS

The foregoing and other objects and aspects of the invention will become further apparent from the following description of embodiments with reference to the accompanying drawings in which.

DETAILED DESCRIPTION OF THE PREFERRED EMBODIMENT

Figure 1:
FIG. 1 is a graph illustrating the irregular energy strength of an excimer laser beam.
Figure 2:
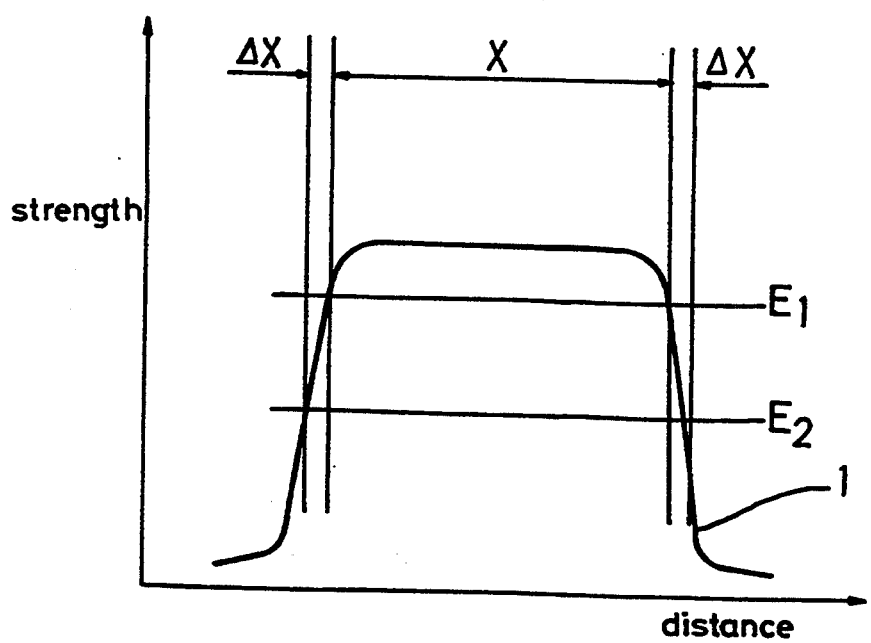
FIG. 2 is a graph illustrating the regular energy strength of an excimer laser beam.
Figure 3:
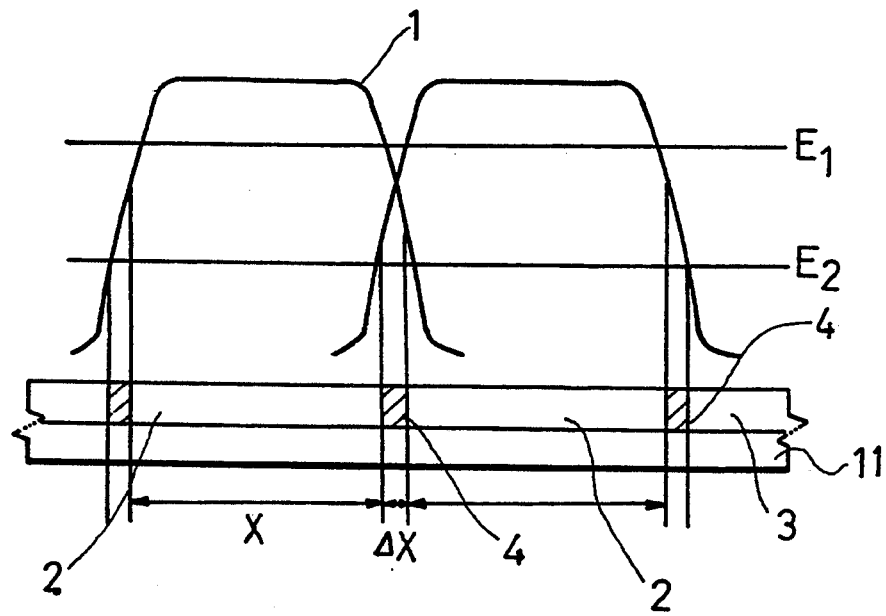
FIG. 3 is a schematic sectional view of a uniform polycrystalline silicon thin film crystallized in accordance with the prior art.
Figure 4:
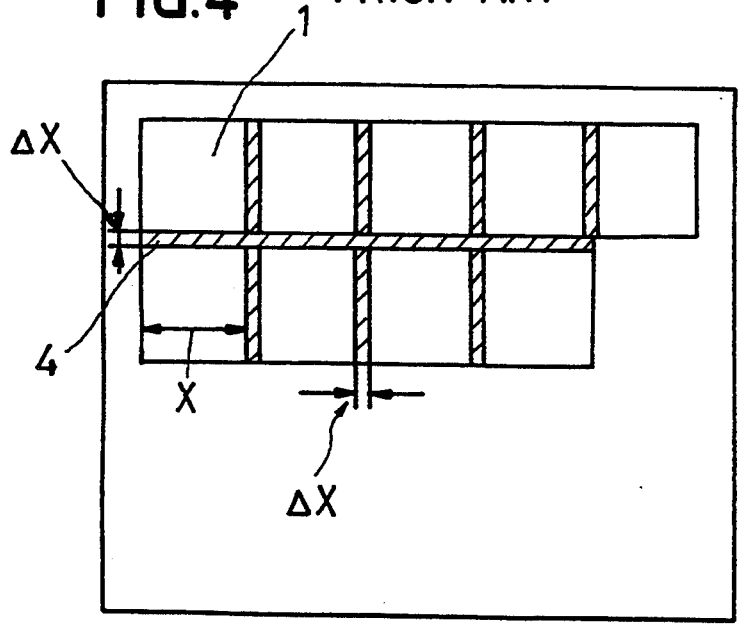
FIG. 4 is a schematic plan view of the uniform polycrystalline silicon thin film shown in FIG. 3.

When the energy strength of an excimer laser beam is spatially homogenized, it has the form shown in FIG. 2. If the regular energy portion of the excimer laser beam is adjusted to have an energy strength proper to crystallize a-Si into p-Si, a portion of a-Si corresponding to the peripheral portion X of the excimer laser beam is changed into $\mu$-Si, because the peripheral portion $\Delta X$ has a weak energy strength. Accordingly, the present invention is intended to remove the energy strength of the peripheral portion X of the excimer laser beam by using a concave microlens and a metal reflection film, so as to cause the portion of a-Si that would otherwise be changed into $\mu$-Si remain at its a-Si state.

Figure 5:
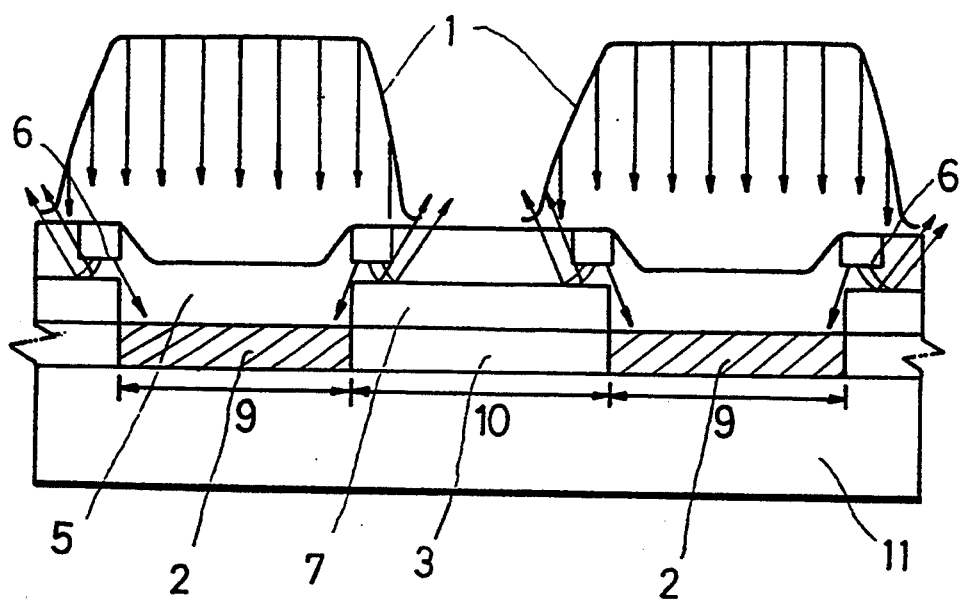
FIG. 5 is a schematic sectional view of a uniform polycrystalline silicon thin film crystallized in accordance with the present invention.

To this end, as shown in FIGS. 5 and 6, the present invention provides a metal reflection film 7 formed at the a-Si film 3 and adapted to reflect the excimer laser beam, an SiO$_2$ insulating film 8 interposed between the a-Si film 3 and the metal reflection film 7 and adapted to restrain an undesirable reaction from occurring between the a-Si film 3 and the metal reflection film 7 due to a high temperature heat upon annealing, and microlenses disposed at the upper surface of the metal reflection film and adapted to scatter the energy of the peripheral portion of excimer laser beam and thus prevent gathering of energy.

Referring to FIGS. 6a to 6f, there is illustrated a method for making a polycrystalline silicon thin film in accordance with the present invention.

Figure 6A:
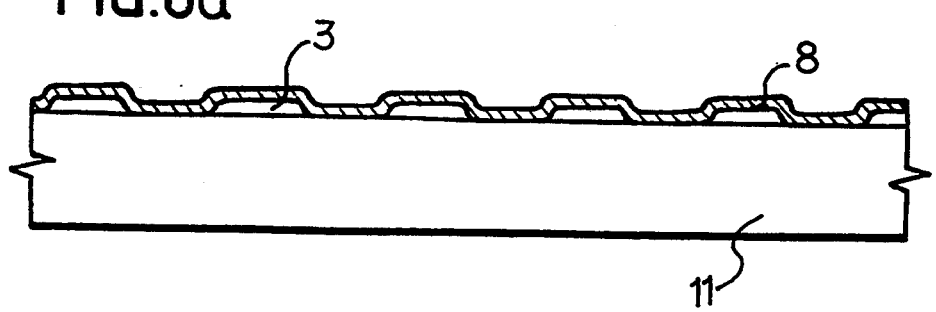
FIGS. 6a to 6f are schematic sectional views illustrating a method of making a uniform polycrystalline silicon thin film in accordance with the present invention.

In accordance with the method, first, an a-Si thin film formed over a substrate 11 is patterned using a photo-etching method, so as to have a pattern of a desired shape. Over the resultant entire exposed surface, there is then formed a SiO$_2$ insulating film 8 having a thickness of at least 1,000 Å, as shown in FIG. 6a. The formation of the SiO$_2$ insulating film 8 is achieved using a general thin film forming method such as the chemical vapor deposition (CVD) method or the sputtering method.

Thereafter, a metal reflection film 7 is formed over the insulating film 8, so as to have a thickness of at least 1,000 Å. The material of metal reflection film 7 may include a metal such as gold, silver or copper. The formation of metal reflection film 7 is achieved using a general semiconductor thin film forming method such as the sputtering method or the evaporation method.

Figure 6B:
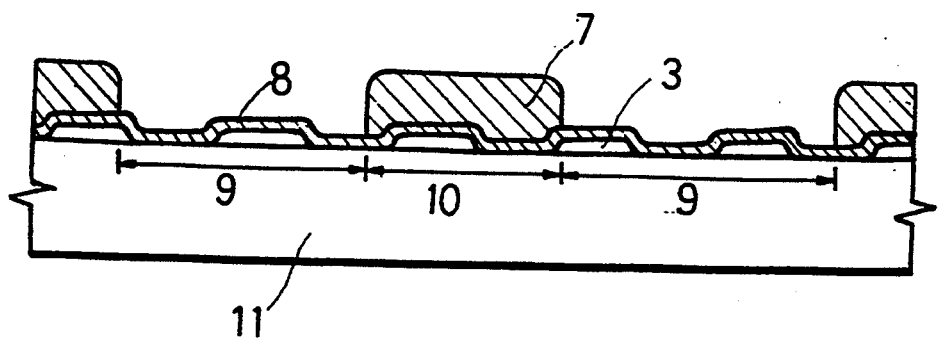
Figure 6C:
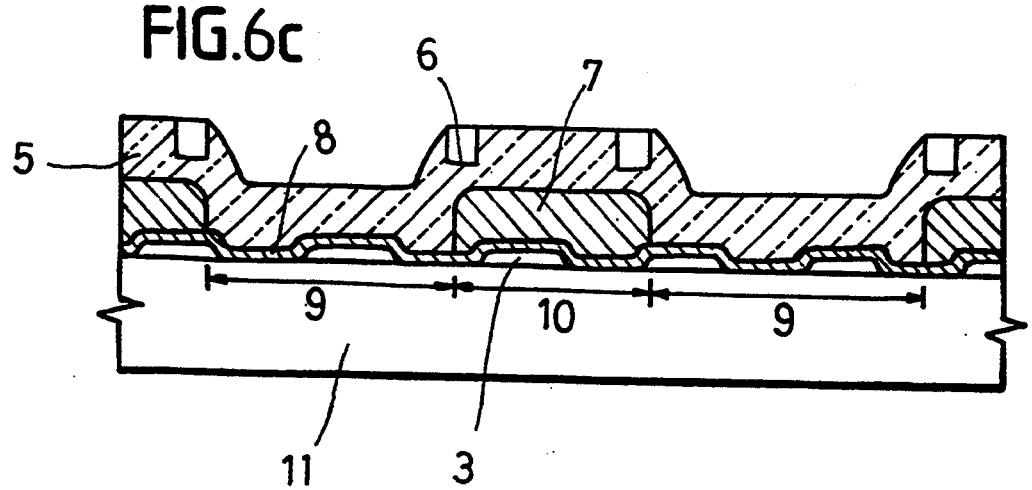

The metal reflection film 7 is then subjected to photo-etching for forming a plurality of windows 9. In accordance with the present invention, the width of each window 9 is smaller than the width of the regular strong energy portion X of laser beam, as shown in FIG. 6b. On the other hand, the width of each portion of remaining metal reflection film 7 is larger than the width of the peripheral portion $\Delta X$ of laser beam causing a-Si to be crystallized into $\mu$-Si, but smaller than the width of the regular strong energy portion X of laser beam, so as to prevent the energy of laser beam from penetrating the portions of a-Si disposed beneath the remaining metal reflection film 7, Thereafter, a plurality of microlenses 6 are formed at the upper surface of the metal: reflection film 7. The microlenses 6 are adapted to scatter the energy of the peripheral portion $\Delta X$ of laser beam and thus prevent it from contributing to crystallization of a-Si. The formation of microlenses 6 can be achieved by forming over the resultant entire exposed surface a thin film 5 made of a material, such as SiO$_2$, with a low refractive index of, for example, about 1.45, as shown in FIG. 6c, photo-etching the thin film 5, to form a plurality of grooves disposed above edges of the portions of the metal reflection film 7, and depositing a material, such as Si$_3$N$_4$, having a high refractive index of, for example, about 2.0 over the grooves the sputtering method or the chemical vapor deposition method, to form the microlenses 6, each having a concave shape shown in FIG. 6d.

Subsequently, annealing using an excimer laser is carried out through the windows 9. By the annealing, the portions of a-Si thin film 3 exposed through the windows 9 are crystallized into p-Si thin film portions 2. After the crystallization, the metal reflection film 7 and the microlenses 6 are removed, to expose the remaining portions of the a-Si thin film 3, as shown in FIG. 6e. The exposed remaining portions of the a-Si thin film 3 are then crystallized by using an excimer laser beam, as shown in FIG. 6f. Thus, the entire surface of the substrate is uniformly subjected to the laser annealing. Accordingly, a p-Si thin film is formed.

When the laser beam is scanned during the annealing such that its regular energy portion is overlapped with each corresponding window 9, each microlens 6 disposed adjacent to an edge of each corresponding window 9 serves to refract the energy strength of the peripheral portion X of laser beam toward the regular strong energy portion X of laser beam and thus scatter the energy strength of the peripheral portion X of laser beam. Accordingly, the weak energy strength of the peripheral portion $\Delta X$ of laser beam partially contributes to the crystallization of a-Si into p-Si, the remaining energy strength portion is reflected on or absorbed in the metal reflection film 7. As a result, the portions of a-Si thin film 3 disposed beneath the metal reflection film 7 are not crystallized, but still remain at a-Si state. After the portions of a-Si thin film 3 disposed beneath the windows 9 are completely crystallized, the remaining portions of the metal reflection film 7 and the thin film 5 including the microlenses 6 are removed, to expose the remaining portions of the a-Si thin film 3, as mentioned above. Thereafter, the remaining portions of a-Si thin film 3 are crystallized using the same laser beam. At this time, the already crystallized portions disposed beneath the windows 9, that is, p-Si thin film portions 2 are undesirably affected by the laser beam possibly scanned thereto, since they are already at a stable state.

Thus, the entire portions of the a-Si thin film 3 can be uniformly crystallized, by making each portion of a-Si thin film 3 to be annealed have a width smaller than the width of the regular strong energy portion X of laser beam.

The present invention will be understood more readily with reference to the following example; however, this example is intended to illustrate the invention and is not to be construed to limit the scope of the present invention.

EXAMPLE

A glass substrate 11 coated with an a-Si thin film 3 was prepared. The a-Si thin film 3 was then patterned using the photo-etching method. Over the patterned a-Si thin film 3, an $SiO_2$ insulating film 8 was then formed using the sputtering method, to have a thickness of 1,000 Å. Thereafter, a metal reflection film 7 made of aluminum was formed over the $SiO_2$ insulating film 8 using the sputtering method, to have a thickness of 1,000 Å. Using the photo-etching method, the metal reflection film 7 was then etched to form windows 9 each having a width smaller than the width of the regular strong energy portion X of laser beam (FIG. 6b). Above the upper surface of the metal reflection film 7 were then formed a plurality of microlenses 6 adapted to scatter the energy of the peripheral portion X of laser beam and thus prevent it from contributing to a crystallization of a-Si. The formation of microlenses 6 was carried out by forming over the resultant entire exposed surface an $SiO_2$ thin film 5 with a low refractive index of about 1.45 and a thickness of 1,500 Å, photo-etching the thin film 5, to form a plurality of grooves disposed above edges of the portions of the metal reflection film 7, and depositing $Si_3N_4$ having a high refractive index of about 2.0 over the grooves according to the chemical vapor deposition method, to form the microlenses 6 each having a concave shape (FIG. 6c) (please refer to Optronics, No. 8, 1991, PP 53 and IEEE Electron Device Letters, Vol. 10, No. 8, Aug. 1989, PP 349).

Figure 6D:
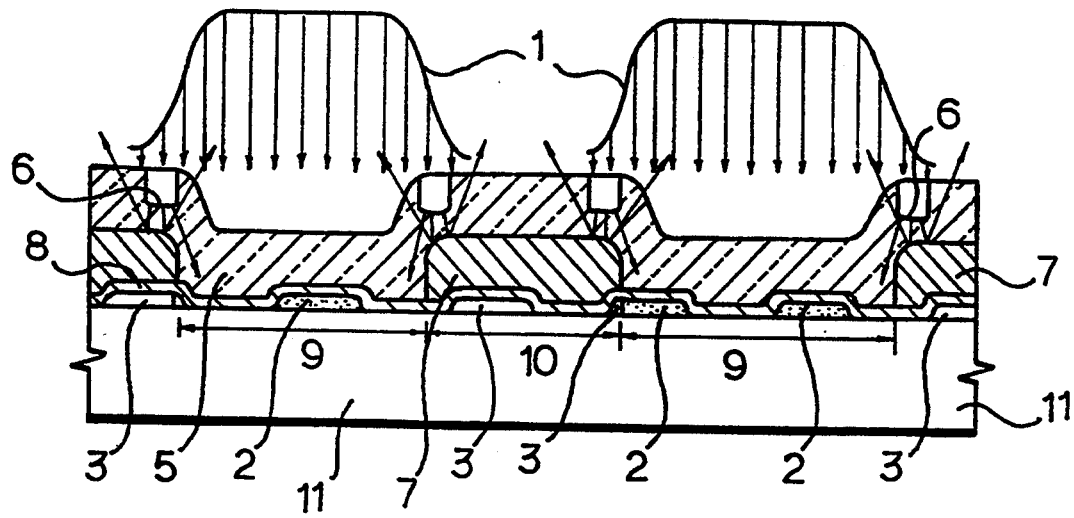
Figure 6E:
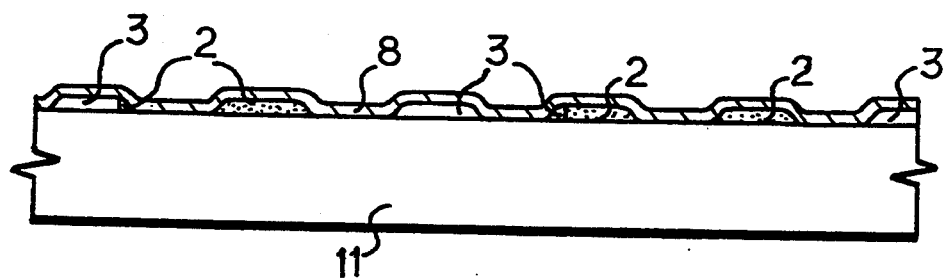
Figure 6F:
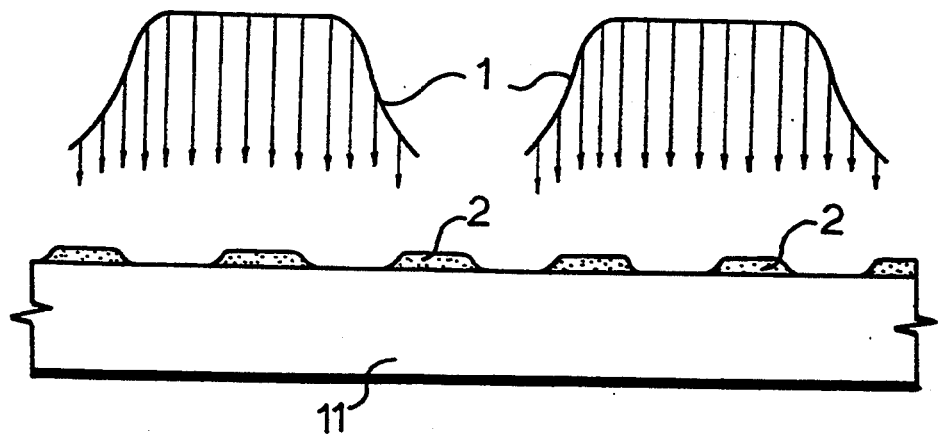

Subsequently, an annealing using an excimer laser was carried out through the windows 9 (FIG. 6d). By the annealing, the portions of a-Si thin film 3 exposed through the windows 9 were crystallized into p-Si thin film portions 2. After the crystallization, the metal reflection film 7 and the microlenses 6 were removed, to expose the remaining portions of the a-Si thin film 3 (FIG. 6e). The exposed remaining portions of the a-Si thin film 3 were then crystallized using the excimer laser beam (FIG. 6f). Thus, the entire surface of the substrate was uniformly subjected to the laser annealing. Accordingly, a p-Si thin film was formed.

As apparent from the above description, the present invention makes it possible to manufacture p-Si thin films using a heat treatment at a low temperature, as compared with conventional methods using a heat treatment at a high temperature. In accordance with the present invention, accordingly, it is possible to use various and inexpensive substrates made of glass, plastic materials or ceramic materials, in place of expensive single crystal substrates or quartz substrates. For obtaining laser beam having a regular energy strength distribution, the present invention utilizes the well-known processes for making semiconductor thin films, without requiring any expensive optical equipments. Accordingly, the present invention provides an economical advantage. The method of the present invention produces uniform p-Si thin films enabling the operating performance and reliance of semiconductor elements to be improved.

What is claimed is:

1. A method for making a polycrystalline silicon film by heat treating an amorphous silicon film using a laser beam, comprising the steps of:

forming an amorphous silicon film upon a substrate;

forming a metal reflection film over the amorphous silicon film;

partially removing the metal reflection film, to form a plurality of spaced windows in the metal reflection film;

forming a plurality of microlenses at positions above the remaining portions of the metal reflection film, respectively;

annealing first portions of the amorphous silicon film disposed beneath the windows using the laser beam, the positions of the microlenses being such that the regular strong energy portion of the laser beam is scanned at each window and the remaining weak energy portion of the laser beam is scattered;

removing the remaining metal reflection film and the microlenses, to expose second portions of the amorphous silicon film disposed beneath where the remaining metal reflection film had been; and annealing the exposed second portions of the amorphous silicon film using the laser beam such that the regular strong energy portion of the laser beam is scanned at each exposed second portion.

2. A method in accordance with claim 1, wherein each of the windows and each portion of the metal reflection film remaining after the step of partially removing the metal reflection film have a width smaller than the width of the regular strong energy portion of the laser beam.

3. A method in accordance with claim 1, wherein each of said positions is a position at which the remaining weak energy portion of the laser beam is scanned upon annealing said first portions of the amorphous silicon film disposed beneath the windows using the laser beam.

4. A method in accordance with claim 1, wherein the substrate is made of glass.

5. A method in accordance with claim 1, wherein the metal reflection film is made of a metal selected from a group consisting of aluminum, gold, silver and copper.

6. A method in accordance with claim 1, wherein the step of partially removing the metal reflection film is carried out using a photo-etching method.

7. A method in accordance with claim 1, wherein the step of forming a plurality of microlenses comprising the steps of forming over the resultant entire exposed surface defined after the formation of the windows a film having a low refractive index, photo-etching the film, to form a plurality of grooves disposed above edges of the portions of the metal reflection film remaining after the formation of the windows, the position of each groove corresponding to a respective one of said positions of said microlenses, and depositing a material having a high refractive index in the grooves, to form the microlenses in the grooves.

8. A method in accordance with claim 1, further comprising the step of forming an $SiO_2$ insulating film over the amorphous silicon film before the step of forming the metal reflection film.

* * * * *